United States Patent [19]
Braathen

[11] Patent Number: 5,121,009
[45] Date of Patent: Jun. 9, 1992

[54] LINEAR PHASE LOW PASS FILTER

[75] Inventor: Russell Braathen, Calgary, Canada

[73] Assignee: NovAtel Communications Ltd., Calgary, Canada

[21] Appl. No.: 539,027

[22] Filed: Jun. 15, 1990

[51] Int. Cl.[5] .......................... H03K 5/00; H03K 9/06
[52] U.S. Cl. .................................. 307/520; 307/522; 328/167
[58] Field of Search ................. 307/520, 521, 520; 328/167; 333/167

[56] References Cited

U.S. PATENT DOCUMENTS

| | | | |
|---|---|---|---|
| 3,609,567 | 9/1971 | Webb | 328/167 |
| 3,736,517 | 5/1973 | Lim | 328/167 |
| 3,845,423 | 10/1974 | Scheine | 333/212 |
| 4,050,023 | 9/1977 | Edgar | 307/520 |
| 4,179,665 | 12/1979 | Gregorian | 328/167 |
| 4,257,006 | 3/1981 | Schaumann | 328/167 |
| 4,338,530 | 7/1982 | Six et al. | 307/520 |
| 4,752,902 | 6/1989 | Goldberg | 328/14 |
| 4,890,065 | 12/1989 | Laletin | 307/520 |
| 4,924,189 | 5/1990 | Senn et al. | 328/167 |

OTHER PUBLICATIONS

Mitra; "Synthesizing active Filters"; Jan. 1969.

Primary Examiner—Stanley D. Miller
Assistant Examiner—Terry D. Cunningham
Attorney, Agent, or Firm—Cesari & McKenna

[57] ABSTRACT

An electrical signal filter composed of a pair of cascaded filter sections in which the group delays of the two filter sections are matched so that their non-linear effects cancel in the passband, resulting in an overall linear phase. In addition, the attenuation slope after the first null in one filter section's stopband response is complemented by the other filter's stopband attenuation. This prevents the overall stopband attenuation from falling to extremely low values as with some filters, which, in turn, limits the time domain overshoot. The passband group delay and stopband attenuation characteristics are controlled by appropriate selection of the passband ripple and filter order number parameters of the filter. In a preferred embodiment, the two filter sections are of the elliptic and Chebyschev type. The invention can be implemented as analog-component active filter circuit or as a digital filter.

5 Claims, 2 Drawing Sheets

LINEAR PHASE LOW PASS FILTER

FIELD OF THE INVENTION

This invention relates generally to electric signal filters, and particularly to a low pass filter exhibiting linear phase shift and sharp cut off.

BACKGROUND OF THE INVENTION

Electric signal filters are circuits which pass signals having frequencies of interest while rejecting or attenuating undesired signals. The range of frequencies relatively unattenuated by the filter is called the passband; the range of significant attenuation is called the stopband.

In many applications, the amount of variation in attenuation, or ripple, in the passband must be limited to a small amount, such as 1 decibel (dB). For a low-frequency passing ("low pass") filter, the passband is typically defined to be all frequencies attenuated less than 3 dB; the 3 dB frequency is thus referred to as the cutoff frequency. With a low pass filter, as frequency increases above the cutoff frequency, the attenuation response continues to drop off through a transition region to the stopband. The stopband is typically defined as including those frequencies experiencing some minimum attenuation, such as 40 dB. A filter is said to have a sharp cutoff if the range of frequencies within its transition region is relatively small.

A specific attenuation response does not completely describe the transmission properties of a filter. Another parameter of importance is the phase shift of the output signal relative to the input signal. In fact, the phase shift response is often of primary importance in applications such as digital communications where the input signal must be amplitude-limited. This is because even if the input signal's major frequency components are entirely within the filter's passband, the output signal may be distorted if the propagation delay for different frequencies through the filter is not constant. Constant time delay corresponds to a phase shift increasing linearly with frequency; hence the terms "linear phase shift filter" and "constant group delay filter" are interchangeable. Thus, sharp cutoff, minimum ripple, and constant group delay are all desirable filter characteristics in digital signal applications.

Filters can also be described in terms of their time domain properties such as rise time, overshoot, and settling time. These are also important considerations when filtering digital signals. Unfortunately, these optimum time domain response requirements often conflict with optimum frequency domain requirements. For example, the need for limited rise time and overshoot often conflicts with constant group delay and sharp cutoff requirements.

Various types of low-pass filters have been developed which optimize one or more of the aforementioned parameters. However, these filters invariably optimize one particular parameter of the frequency or time domain response at the expense of other parameters. For example, a Butterworth filter provides minimum ripple in the passband for a given number of poles, but it has a large transition region, i.e., its cutoff is not very sharp, and it has relatively poor group delay characteristics.

The Chebyschev filter allows greater ripple to occur throughout the passband, which has the effect of greatly improving the sharpness of the cutoff. A Chebyschev filter is specified in terms of the number of poles and allowable passband ripple; its amplitude response in the frequency domain may be expressed as $$\frac{1}{[1 + \epsilon^2 C_N^2(f/f_c)]}$$

where N is the number of poles, $C_N$ is the Chebyschev polynomial of the first kind of degree N, $\epsilon$ is a constant that sets the passband ripple amount, f is frequency and $f_c$ is the desired cutoff frequency. Chebyschev filters are optimum in the sense that they require the fewest number of poles for a prescribed maximum ripple and sharpest possible cutoff. However, with a Chebyschev filter, relatively constant group delay is realized only when sharp cutoff is avoided. Furthermore, even an ideal Chebyschev filter exhibits about 26% overshoot in the time domain; in practice this may be 40% or more.

An elliptic filter distributes ripple in both the passband and the stopband; indeed, it can be proven that an elliptic filter has the sharpest possible cutoff for a given number of poles N. The amplitude response of an elliptic filter is given by:

$$\frac{1}{1 + \epsilon^2 U_N^2(f/f_c)}$$

where $U_N$ is a Jacobian elliptic function. Here, $\epsilon$ specifies the ripple amount across the entire range of frequencies. Unfortunately, the elliptic filter is less than ideal for many digital signal applications since the stopband cutoff is very steep. This, in turn, means that the time domain response will exhibit large overshoot and long settling time.

Bessel filters are generally recognized as maximally phase-linear. The Bessel filter's time domain characteristics are excellent, and its time domain response exhibits very little overshoot; in fact, it exhibits undershoot. However, this undershoot phenomenon means that successive data bits of different polarities may interfere with one another; this, in turn, means that extra bandwidth must be allocated for a Bessel-filtered signal.

Another type of filter, called a transitional filter, is a compromise between the Chebyschev and Bessel filters. Certain inductor-capacitor implementations of this filter can achieve sharp frequency domain cutoff with about 15% overshoot. However, generally useful active filter implementations with non-ideal operational amplifiers typically introduce delays which are not taken into account in the theoretical analysis. As a consequence, real-world implementations of transitional filters tend to exhibit greater overshoot and less out-of-band attenuation than the theoretical analysis would otherwise indicate. These problems can be alleviated somewhat with high gain-bandwidth amplifiers, but these are expensive and prone to oscillation if not carefully designed.

What is needed for digital signal filtering applications is an inexpensive, linear-phase filter with sharp cutoff that exhibits low overshoot in the time domain.

SUMMARY OF THE INVENTION

Briefly, the invention is a filter composed of a pair of cascaded filter sections. The group delays of the two filter sections are matched so that their non-linear effects cancel in the passband, which results in an overall linear phase. In addition, the attenuation reduction after a first null in one section's stopband response is complemented by the other filter's stopband attenuation. This prevents the overall stopband attenuation from falling to extremely low values as with some filters, which, in turn, limits the time domain overshoot. The passband group delay and stopband attenuation characteristics are controlled by appropriate selection of the passband ripple and filter order number parameters of the filter.

In a preferred embodiment, the two sections are of the Chebyschev and elliptic type. The invention can be implemented as analog-component active filter circuit or as a digital filter. In addition, not all of the sections of a given type need to be cascaded in order; thus, for example, one or more Chebyschev sections may be followed by one or more eliptic sections, which in turn are followed by additional Chebyschev sections.

There are several advantages to the invention. It has better phase linearity than a standard Chebyschev, and good stopband attenuation, similar to a Bessel filter. The attenuation roll-off is much sharper than either a Butterworth or transitional filter. The in-band ripple is only about 2.2%, and the stopband attentuation at double the cutoff frequency is better than 50 dB. Also, it exhibits fairly low overshoot in the time domain, less than 10%, without the need for high gain-bandwidth amplifiers.

As a result, not only is the filter's output less distorted because of greater phase linearity, but also a transmitted digital signal uses less frequency spectrum than previously available filters, since the cutoff is sharper.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
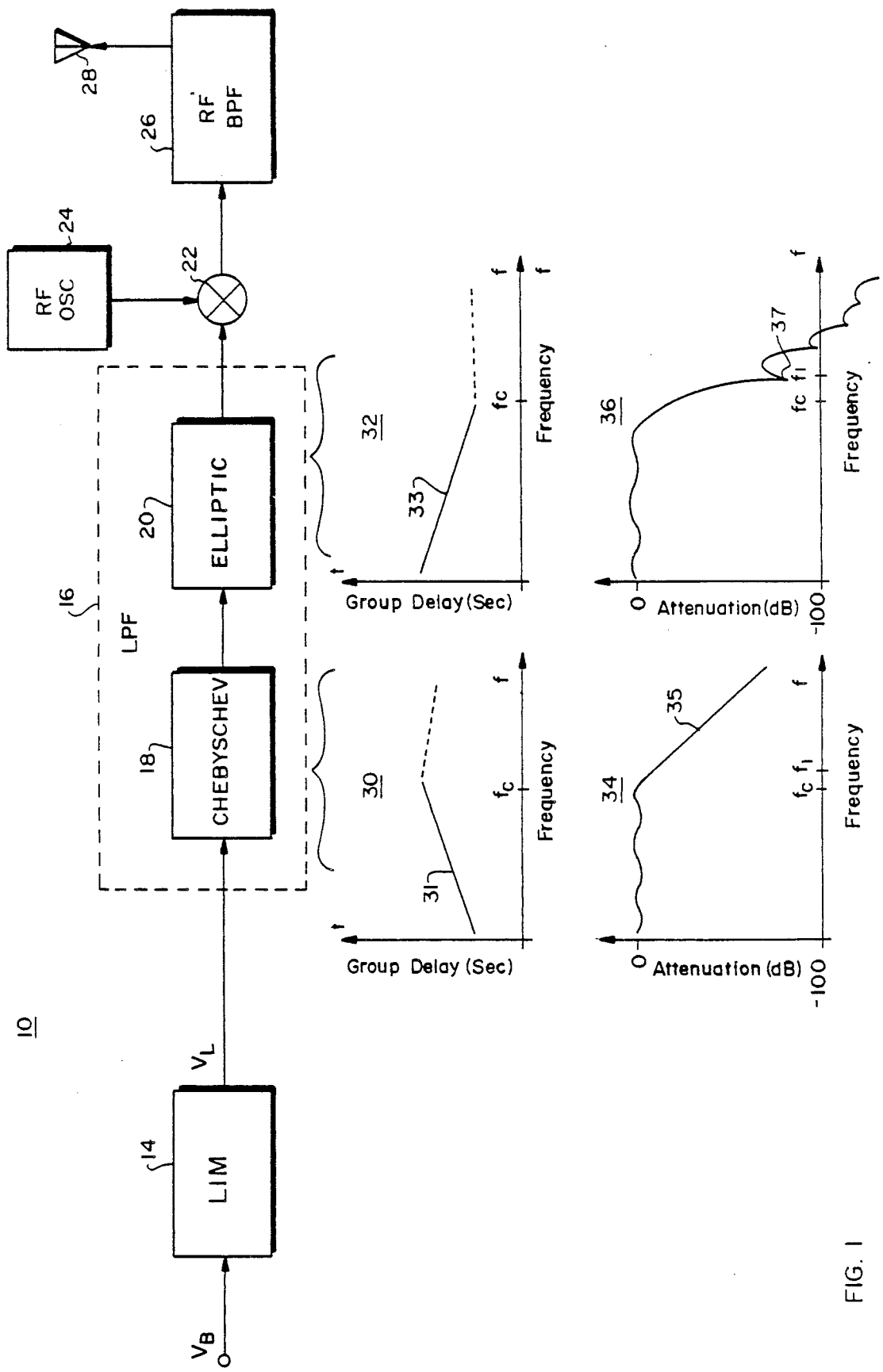
FIG. 1 is a block diagram of a typical digital signal transmission system which makes use of the inventive filter.

FIG. 1 is a block diagram of a transmitter system 10 in which a baseband audio signal $V_B$ is fed via an amplitude limiter 14 to a low pass filter 16 to limit its frequency: The signal is up-converted by a mixer 22 fed by a radio frequency (RF) oscillator 24, and then frequency-limited by an RF bandpass filter 26 before being fed to an antenna 28 for transmission. The illustrated transmitter 10 is typical of one used in a cellular telephone wherein the amplitude of the baseband signal $V_B$ must be limited in order to limit the amount of radiated output power; however, the invention may also be used in other systems in which a digital signal $V_B$ is fed to the low pass filter 16.

The present invention pertains to the design and operation of the low pass filter 16. Specifically, the low pass filter 16 consists of a Chebyschev filter section 18 and an elliptic filter section 20. The group delay and attenuation characteristics of the Chebyschev filter 18 and elliptic filter 20 are the distinguishing features. As shown in the plot 30 of group delay versus frequency, the Chebyschev filter 18, has a linear group delay with a particular slope, as indicated by the curve 31, from zero frequency up to a cutoff frequency, $F_c$. Similarly, the group delay of the elliptic filter 20, as shown in the curve 32, is also linear from zero frequency up to the cutoff frequency $F_c$. However, by comparing the curves 31 and 32 it is evident that the slopes of the group delay of filters 18 and 20 are opposite; thus, their cumulative effect is to provide a relatively constant group delay for all frequencies below $F_c$.

The attenuation characteristics of the Chebyschev filter 18 and elliptic filter 20 are also matched. As shown in the attenuation curve 36 which plots decibels versus frequency, the elliptic section 20 exhibits an extremely sharp null 37 at a frequency $F_1$ slightly greater than the cutoff frequency $F_c$. This is an extremely low attenuation point, typically approaching $-80$ dB or more. In order to compensate for this, as shown in the attenuation curve 34, the Chebyschev section 20 is chosen such that its attenuation point 35 at the frequency $F_1$ is quite a bit less, on the order of $-30$ dB. The cumulative effect is that the relatively steep rolloff of the elliptic filter is complemented by the much gentler rolloff of the Chebyschev filter 20. This helps to prevent the large time-domain overshoot normally experienced with a simple elliptic filter.

Thus a distinguishing characteristic of the low pass filter 16 is that the passband phase of the Chebyschev section 18 compliments the passband phase of the elliptic section 20; in addition, the attenuation slopes after the first null in the Chebyschev section 18 frequency response are selected to prevent the overall stopband attenuation from falling to extremely low values.

The inventive filter 16 sufficiently attenuates the second and higher harmonic frequencies while exhibiting a passband phase linearity better than simple elliptic or Chebyschev filters. While the phase linearity is not quite as good as a Bessel filter, the attenuation of stopband signals is far better. This is a distinct advantage in applications for which sharp cutoff is also important.

For example, a simple Bessel filter can typically produce only about 15 dB of attenuation at twice the cutoff frequency. Thus, if a Bessel filter is used to filter a digital signal, the data bits will interfere with one another unless the fundamental data rate of the signal to be transmitted is limited to something less than one half the cutoff frequency. However, with the low pass filter 16 in accordance with the invention, a signal at twice cutoff frequency is attenuated by about $-50$ dB. This greatly increases the spectrum utilization of the transmitter 10.

The attenuation and group delay characteristics of the Chebyschev section 18 and elliptic section 20 are chosen by appropriately selecting the number of poles, ripple constant, and other filter parameters. Those skilled in the art will recognize that the filter sections 18 and 20 may be embodied in a variety of ways, such as passive component filters, active filters, or digital filters. In addition, the order of the sections 18 and 20 may be reversed, i.e., with the elliptic section 20 placed before the Chebyschev section 18, or the poles of each section may be interspersed, with several Chebyschev poles followed by several elliptic poles and followed by additional Chebyschev poles.

Figure 2:
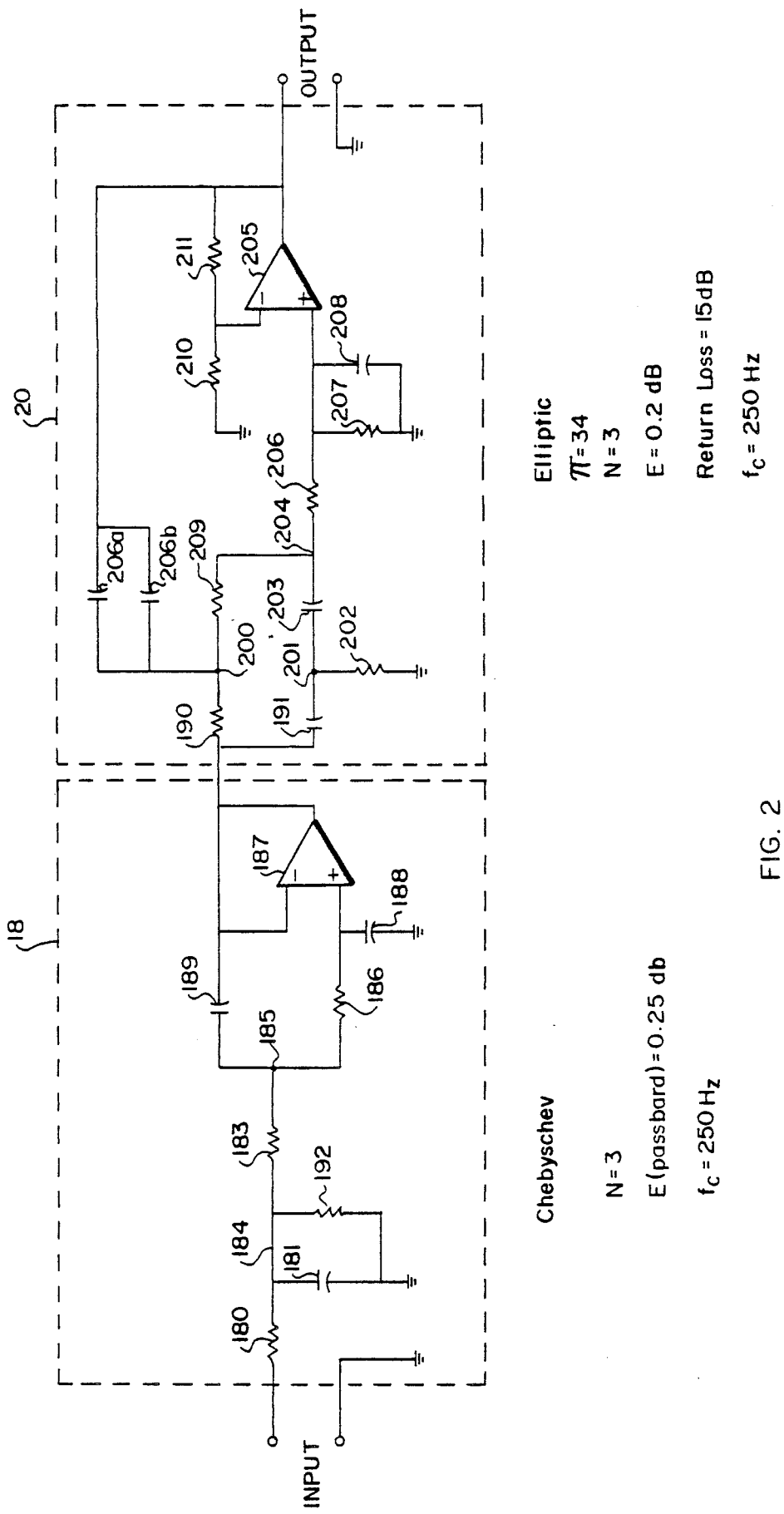
FIG. 2 is a circuit diagram of an active-filter embodiment of the invention.

Turning attention now to FIG. 2 a particular embodiment of an active filter circuit embodiment will be discussed in greater detail.

The illustrated circuit has a Chebyschev section 18 in the filter order, N, is 3 and the passband error coefficient $\epsilon$ is 0.25 dB. This section was also chosen to have a cutoff frequency ($F_c$) of 250 hz. The Chebyschev section 18 (the topography of which is known in the art) includes a resistor 180 connected between the input and a node 184, a capacitor 181 and resistor 182 shunted to ground from the node 184, and a resistor 183 coupled between the node 184 and another node 185. A resistor 186 is coupled between the node 185 and the non-inverting input of an operational amplifier 187, and a capacitor 188 is connected between the non-inverting input of amplifier 187 and ground. Another capacitor 189 is connected between the node 185 and the inverting input of the amplifier 187. The output of the amplifier is fed back to the inverting input, and also provides the output of the Chebyschev section 18.

In the elliptic section 20, (the topography of which is also known in the art), the input is provided to a resistor 190 and capacitor 191. The other terminal of the resistor 190 is connected to a node 200. The other terminal of capacitor 191 is connected to a node 201; a shunt resistor 202 is connected between the node 201 and ground. The voltage divider formed by the resistors 190, 209, and 202 and capacitors 191 and 203 provide feedback to the amplifier 205 to give it the characteristic elliptic response having a sharp cutoff. A capacitor 203 is connected between the node 201 and another node 204; the node 204 is also connected to the non-inverting input terminal of an amplifier 205 through a series resistor 206. A shunt resistor 207 and capacitor 208 are also connected to the non-inverting input terminal of the amplifier 205. Node 200, on the other hand, is coupled to the output of the amplifier 205 through a pair of capacitors 206A and 206B connected in parallel; the node 200 is also connected to the node 204 through a resistor 209. Finally, the inverting input of amplifier 205 is connected to ground through a resistor 210 as well as to capacitors 209a and 209b through a resistor 211. The output of the filter 16 is available at the output of the amplifier 205. The elliptic section 20 has N=3, a$\pi$(a constant which sets the relative cutoff frequency) equal to 34, an $\epsilon$=0.2 dB and a cutoff frequency of 250 Hz.

The circuit illustrated in FIG. 2 provides a 3 dB cutoff frequency of 250 Hz, an attenuation of about $-50$ dB at twice the cutoff at 500 Hz and exhibits a peak-to-peak time domain overshoot of 9.6%. A parts list is as follows:

| | |
|---|---|
| resistor 180 | 120k $\Omega$ |
| capacitor 181 | 22 $\mu$F |
| resistor 182 | 82k $\Omega$ |
| resistor 183 | 47K $\Omega$ |
| resistor 186 | 47K $\Omega$ |
| capacitor 188 | 1.2 $\mu$F |
| capacitor 189 | 0.1 $\mu$F |
| amplifier 187, 205 | TL 272 |
| resistor 190 | 3.9K $\Omega$ |
| capacitor 191 | 47 $\mu$F |
| resistor 202 | 6.2K $\Omega$ |
| capacitor 203 | 27 $\mu$F |
| resistor 203 | 5.2K $\Omega$ |
| resistor 206 | 1K $\Omega$ |
| resistor 207 | 33K $\Omega$ |
| capacitor 208 | 39 $\mu$F |
| capacitors 209A, B | 0.1 $\mu$F |
| resistor 210 | 10K $\Omega$ |
| resistor 211 | 3.9K $\Omega$ |

The inventive filter 16 increases the spectrum utilization in data transmission as well audio transmission applications. For example, if the time domain step response of a fifth order, normalized 1 Hz Bessel filter is considered, the period during which the output response steps from 10% to 90% of its final values is 1.2 seconds to 3.3 seconds. The effect is to spread the information over more than one bit-time, indicating that the Bessel filter must be set to have a cutoff frequency of about 2.1 times the bit rate of the data signal in order to sufficiently limit the amount of interference between symbols. However, for the normalized step response of the inventive filter, the equivalent period is about 0.357 seconds to 1.155 seconds. This allows a cutoff frequency of about 0.798 times the bit rate of the data signal to limit intersymbol interference to about 10%. Thus, the invention affords a much greater use of the available bandwidth.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed is:

1. An electrical signal filter comprising:
    a low pass elliptic filter section, connected to receive an input signal, and having a group delay which varies with frequency;
    a low pass Chebyschev filter section, connected to receive the output of the elliptic filter section, and having a group delay matched to the group delay of the elliptic filter,
    whereby the combined group delay responses of the elliptic and Chebyschev filter sections provide an overall linear phase, over a range of different frequencies.

2. An electric signal filter as in claim 1 wherein the Chebyschev filter section additionally has a high frequency stopband attenuation characteristic to provide a predetermined maximum amount of overshoot in the time domain response of the electrical signal filter.

3. An electrical signal filter as in claim 1 wherein the elliptic section additionally has three poles and an error coefficient of approximately 0.2 dB, and the Chebyschev section has three poles and a passband ripple amount of approximately 0.25 dB.

4. An electrical signal filter as in claim 1 wherein the chebyschev section comprises:
    an input terminal;
    a first resistor connected between the input terminal and a first node;
    a first capacitor connected between the first node and a ground reference node;
    a second resistor also connected between the first node and the ground reference node;
    a third resistor connected between the first node and a second node;
    an operational amplifier having non-inverting and inverting input terminal;
    a fourth resistor connected between the second node and the non-inverting input of the operational amplifier;
    a second capacitor connected between the non-inverting input terminal of the amplifier and the ground reference node; and
    a third capacitor connected between the second node and the inverting input of the amplifier.

5. An electrical signal filter as in claim 1 wherein the elliptic section comprises:
    a first capacitor connected between a first node and a second node;
    a first resistor connected between the first node and a ground reference node;

an operational amplifier having non-inverting and inverting input terminals;

a second resistor connected between the second node and the non-inverting input of the amplifier;

a third resistor connected between the non-inverting input of the amplifier and the ground reference node;

a second capacitor connected between the non-inverting input of the amplifier and the ground reference node;

a fourth resistor connected between the inverting input of the amplifier and the ground reference node; and a fifth resistor connected between the output of the amplifier and the inverting input of the amplifier.

* * * * *